(12) United States Patent
Sverdlov et al.

(10) Patent No.: US 11,711,120 B1
(45) Date of Patent: Jul. 25, 2023

(54) POWER ADJUSTMENT TO ALIGN TRANSMIT CHAIN POWER RATIOS

(71) Applicant: QUALCOMM Incorporated, San Diego, CA (US)

(72) Inventors: Alexander Sverdlov, Rehovot (IL); Igor Gutman, Hod HaSharon (IL); Carl Hardin, Encinitas, CA (US); Michael Lee McCloud, San Diego, CA (US); Robert Zokaim, Kfar Saba (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/661,460

(22) Filed: Apr. 29, 2022

(51) Int. Cl.
*H04B 7/0426* (2017.01)
*H04B 7/08* (2006.01)
*H04B 7/06* (2006.01)
*H04B 7/0456* (2017.01)

(52) U.S. Cl.
CPC .......... *H04B 7/043* (2013.01); *H04B 7/0465* (2013.01); *H04B 7/0639* (2013.01); *H04B 7/0857* (2013.01)

(58) Field of Classification Search
CPC ........ H04B 7/022; H04B 7/024; H04B 7/026; H04B 7/04; H04B 7/043; H04B 7/0465; H04B 7/0639; H04B 7/0857; H04B 2001/0408; H04B 2001/0416; H04B 2001/0425; H04B 2001/0441; H04B 2001/045; H04B 1/0483; H04G 3/3042
See application file for complete search history.

(56) References Cited

U.S. PATENT DOCUMENTS

| | | | | |
|---|---|---|---|---|
| 5,392,463 | A * | 2/1995 | Yamada | H03F 3/211 |
| | | | | 455/93 |
| 8,351,543 | B2 * | 1/2013 | Kenington | H03F 3/24 |
| | | | | 375/267 |
| 8,903,344 | B2 * | 12/2014 | Yan | H03H 7/24 |
| | | | | 455/67.11 |
| 9,325,282 | B2 * | 4/2016 | Bowers | H03F 3/195 |
| 9,831,833 | B1 * | 11/2017 | Xie | H04B 1/40 |
| 10,027,354 | B2 * | 7/2018 | Cohen | H04B 1/04 |
| 10,069,467 | B1 * | 9/2018 | Carvalho | H03F 1/0294 |
| 10,469,109 | B2 * | 11/2019 | Gutman | H03F 3/24 |
| 10,541,657 | B2 * | 1/2020 | Gutman | H03F 1/3247 |
| 11,283,666 | B1 * | 3/2022 | McCormick | H04B 1/04 |
| 11,489,700 | B2 * | 11/2022 | Zach | H04B 1/0475 |
| 11,496,171 | B1 * | 11/2022 | Laufer | H04B 1/123 |
| 11,515,953 | B1 * | 11/2022 | Gutman | H04B 17/345 |
| 11,611,379 | B2 * | 3/2023 | Sahraei | H04B 7/0465 |

(Continued)

*Primary Examiner* — James M Perez
(74) *Attorney, Agent, or Firm* — Harrity & Harrity LLP

(57) ABSTRACT

Various aspects of the present disclosure generally relate to wireless communication. A wireless communication device may have an apparatus that aligns the non-linearity between transmit chains of the wireless communication device that are driven by the same digital port. The apparatus may adjust an amplification power out or an amplification saturated power to adjust a ratio between the amplification saturated power and the amplification power out for one or more transmit chains of the wireless communication device. The apparatus may adjust the ratios of transmit chains to align the ratios of the transmit chains for more consistent management of non-linear characteristics of the chain components. Numerous other aspects are described.

26 Claims, 9 Drawing Sheets

(56) References Cited

U.S. PATENT DOCUMENTS

| | | | |
|---|---|---|---|
| 2010/0087227 A1* | 4/2010 | Francos | H03F 3/24 |
| | | | 455/562.1 |
| 2012/0135698 A1* | 5/2012 | Yan | H03H 7/24 |
| | | | 455/127.5 |
| 2013/0027129 A1* | 1/2013 | Langer | H03F 1/56 |
| | | | 330/127 |
| 2013/0154553 A1* | 6/2013 | Steele | B60M 7/003 |
| | | | 320/108 |
| 2014/0354350 A1* | 12/2014 | Bowers | H03F 1/301 |
| | | | 327/564 |
| 2015/0173079 A1* | 6/2015 | Yokomakura | H04L 5/0048 |
| | | | 370/329 |
| 2015/0207464 A1* | 7/2015 | Yamanouchi | H03F 3/19 |
| | | | 375/297 |
| 2015/0282093 A1* | 10/2015 | Kaukovuori | H04W 52/367 |
| | | | 370/311 |
| 2016/0285481 A1* | 9/2016 | Cohen | H03F 1/02 |
| 2018/0254754 A1* | 9/2018 | Carvalho | H03F 3/195 |
| 2019/0068133 A1* | 2/2019 | Gutman | H04L 27/368 |
| 2019/0068429 A1* | 2/2019 | Sagi | H04B 1/0483 |
| 2019/0089389 A1* | 3/2019 | Gutman | H03F 3/24 |
| 2020/0382147 A1* | 12/2020 | Menkhoff | H03F 3/195 |
| 2021/0013838 A1* | 1/2021 | Wang | H04B 1/0458 |
| 2022/0217017 A1* | 7/2022 | Zach | H04L 25/0228 |

\* cited by examiner

POWER ADJUSTMENT TO ALIGN TRANSMIT CHAIN POWER RATIOS

FIELD OF THE DISCLOSURE

Aspects of the present disclosure generally relate to wireless communication and to techniques and apparatuses for adjusting power to align transmit chain power ratios.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include one or more base stations that support communication for a user equipment (UE) or multiple UEs. A UE may communicate with a base station via downlink communications and uplink communications. "Downlink" (or "DL") refers to a communication link from the base station to the UE, and "uplink" (or "UL") refers to a communication link from the UE to the base station.

The above multiple access technologies have been adopted in various telecommunication standards to provide a common protocol that enables different UEs to communicate on a municipal, national, regional, and/or global level. New Radio (NR), which may be referred to as 5G, is a set of enhancements to the LTE mobile standard promulgated by the 3GPP. NR is designed to better support mobile broadband internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink, using CP-OFDM and/or single-carrier frequency division multiplexing (SC-FDM) (also known as discrete Fourier transform spread OFDM (DFT-s-OFDM)) on the uplink, as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

Some aspects described herein relate to a method of wireless communication performed by an apparatus of a wireless communication device. The method may include obtaining, from a digital port, a signal before amplification and transmission on at least a first transmit chain for first antenna elements of the wireless communication device and a second transmit chain for second antenna elements of the wireless communication device. The method may include adjusting an amplification saturated power for the signal for the first transmit chain such that a first ratio of amplification saturated power to amplification output power of the first transmit chain aligns with a second ratio of amplification saturated power to amplification output power of the second transmit chain. The method may include transmitting the signal in association with wireless communication.

Some aspects described herein relate to a method of wireless communication performed by an apparatus of a wireless communication device. The method may include obtaining, from a digital port, a signal before amplification and transmission on at least a first transmit chain for first antenna elements of the wireless communication device and a second transmit chain for second antenna elements of the wireless communication device. The method may include adjusting an amplification output power for the signal for the first transmit chain such that a first ratio of amplification saturated power to amplification output power of the first transmit chain aligns with a second ratio of amplification saturated power to amplification output power of the second transmit chain. The method may include transmitting the signal in association with wireless communication.

Some aspects described herein relate to an apparatus of a wireless communication device. The apparatus may include a memory and one or more processors coupled to the memory. The one or more processors may be configured to obtain, from a digital port, a signal before amplification and transmission on at least a first transmit chain for first antenna elements of the wireless communication device and a second transmit chain for second antenna elements of the wireless communication device. The one or more processors may be configured to adjust an amplification saturated power for the signal for the first transmit chain such that a first ratio of amplification saturated power to amplification output power of the first transmit chain aligns with a second ratio of amplification saturated power to amplification output power of the second transmit chain. The one or more processors may be configured to transmit the signal in association with wireless communication.

Some aspects described herein relate to an apparatus of a wireless communication device. The apparatus may include a memory and one or more processors coupled to the memory. The one or more processors may be configured to obtain, from a digital port, a signal before amplification and transmission on at least a first transmit chain for first antenna elements of the wireless communication device and a second transmit chain for second antenna elements of the wireless communication device. The one or more processors may be configured to adjust an amplification output power for the signal for the first transmit chain such that a first ratio of amplification saturated power to amplification output power of the first transmit chain aligns with a second ratio of amplification saturated power to amplification output power of the second transmit chain. The one or more processors may be configured to transmit the signal in association with wireless communication.

Some aspects described herein relate to a non-transitory computer-readable medium that stores a set of instructions for wireless communication by a wireless communication device. The set of instructions, when executed by one or more processors of the wireless communication device, may cause the wireless communication device to obtain, from a digital port, a signal before amplification and transmission on at least a first transmit chain for first antenna elements of the wireless communication device and a second transmit chain for second antenna elements of the wireless communication device. The set of instructions, when executed by one or more processors of the wireless communication device, may cause the wireless communication device to adjust an amplification saturated power for the signal for the first transmit chain such that a first ratio of amplification saturated power to amplification output power of the first transmit chain aligns with a second ratio of amplification saturated power to amplification output power of the second transmit chain. The set of instructions, when executed by one or more processors of the wireless communication device, may cause the wireless communication device to transmit the signal in association with wireless communication.

Some aspects described herein relate to a non-transitory computer-readable medium that stores a set of instructions for wireless communication by a wireless communication device. The set of instructions, when executed by one or more processors of the wireless communication device, may cause the wireless communication device to obtain, from a digital port, a signal before amplification and transmission on at least a first transmit chain for first antenna elements of the wireless communication device and a second transmit chain for second antenna elements of the wireless communication device. The set of instructions, when executed by one or more processors of the wireless communication device, may cause the wireless communication device to adjust an amplification output power for the signal for the first transmit chain such that a first ratio of amplification saturated power to amplification output power of the first transmit chain aligns with a second ratio of amplification saturated power to amplification output power of the second transmit chain. The set of instructions, when executed by one or more processors of the wireless communication device, may cause the wireless communication device to transmit the signal in association with wireless communication.

Some aspects described herein relate to an apparatus of a wireless communication device. The apparatus may include means for obtaining, from a digital port, a signal before amplification and transmission on at least a first transmit chain for first antenna elements of the wireless communication device and a second transmit chain for second antenna elements of the wireless communication device. The apparatus may include means for adjusting an amplification saturated power for the signal for the first transmit chain such that a first ratio of amplification saturated power to amplification output power of the first transmit chain aligns with a second ratio of amplification saturated power to amplification output power of the second transmit chain. The apparatus may include means for transmitting the signal in association with wireless communication.

Some aspects described herein relate to an apparatus of a wireless communication device. The apparatus may include means for obtaining, from a digital port, a signal before amplification and transmission on at least a first transmit chain for first antenna elements of the wireless communication device and a second transmit chain for second antenna elements of the wireless communication device. The apparatus may include means for adjusting an amplification output power for the signal for the first transmit chain such that a first ratio of amplification saturated power to amplification output power of the first transmit chain aligns with a second ratio of amplification saturated power to amplification output power of the second transmit chain. The apparatus may include means for transmitting the signal in association with wireless communication.

Aspects generally include a method, apparatus, system, computer program product, non-transitory computer-readable medium, user equipment, base station, network entity, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages, will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, and/or artificial intelligence devices). Aspects may be implemented in chip-level components, modular components, non-modular components, non-chip-level components, device-level components, and/or system-level components. Devices incorporating described aspects and features may include additional components and features for implementation and practice of claimed and described aspects. For example, transmission and reception of wireless signals may include one or more components for analog and digital purposes (e.g., hardware components including antennas, radio frequency (RF) chains, power amplifiers, modulators, buffers, processors, interleavers, adders, and/or summers). It is intended that aspects described herein may be practiced in a wide variety of devices, components, systems, distributed arrangements, and/or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
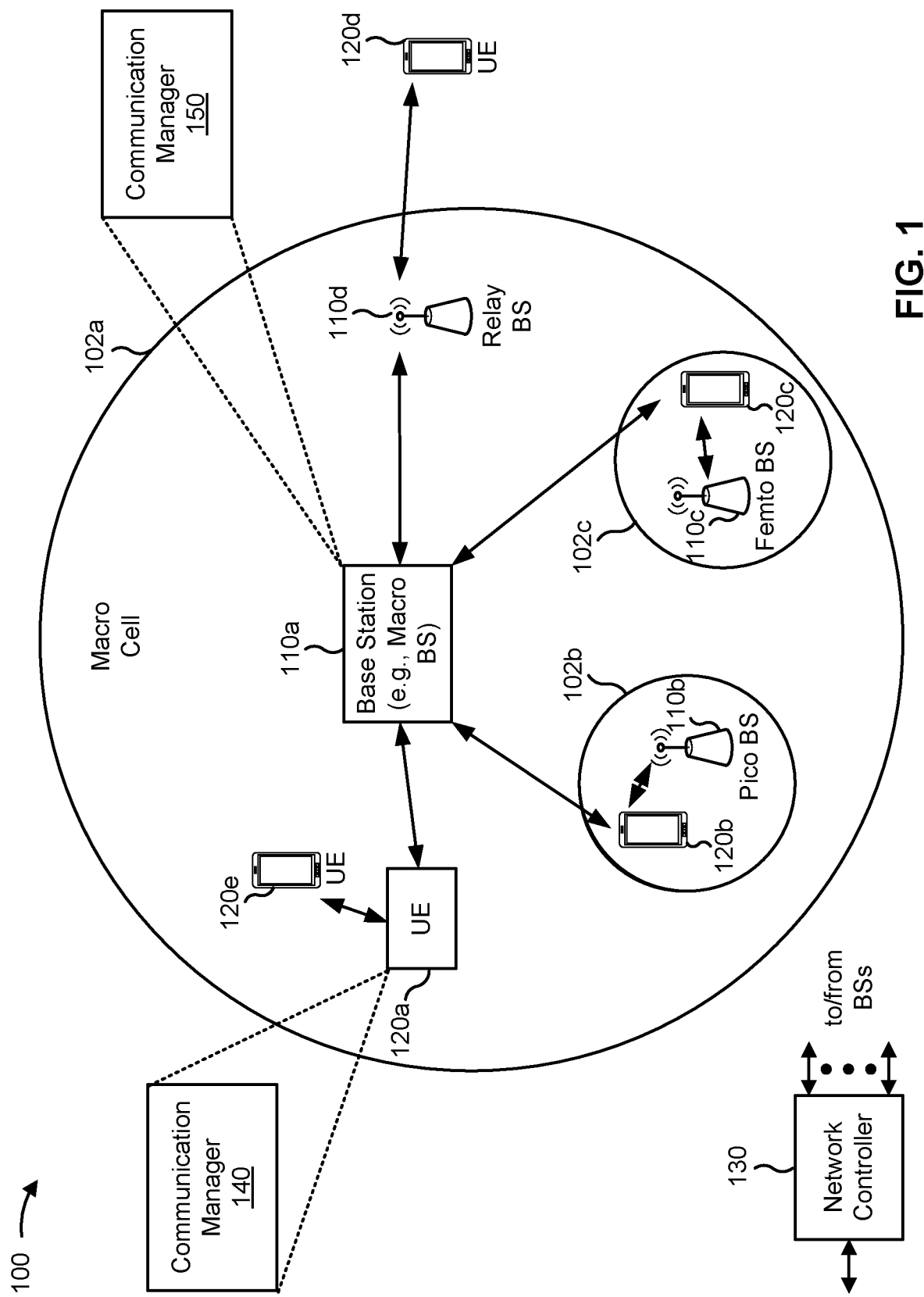
FIG. 1 is a diagram illustrating an example of a wireless network, in accordance with the present disclosure.

A transmitter of a wireless communication device may include non-linear components that cause a transmitted signal to be distorted at higher powers. The transmitter may include transmission chains that each have a front end. A front end may include a power amplifier (PA) and other components to control an amplification output power ($P_{out}$) of a signal from a digital port, up to a maximum output power for the PA. The maximum output power for the PA may be referred to as an "amplification saturated power," or $P_{sat}$. Each transmit chain may be associated with a ratio of $P_{sat}$ to $P_{out}$.

Fifth generation (5G) products may use hybrid analog and digital beamforming architecture in which a single digital port is driving multiple analog chains. Pre-distortion may be applied to an array of PA elements to address distortions, and the assumption is that all of the chains experience the same non-linearity (NL) characteristics. However, this assumption does not hold accurately because each digital port may be connected to, for example, 128 antenna elements that are divided into 16 blasters. A blaster may be a radio frequency chip that is connected to an intermediate-frequency and baseband chip. While the chains belonging to the same blaster have similar NL characteristics, different blasters can have different NL characteristics due to process variations, physical layouts, and/or other reasons. The NL differences can cause a ratio of the PA power at different chains to have different NL characteristics and thus pre-distortion may be suboptimal and lead to error vector magnitude (EVM) and/or adjacent channel leakage ratio (ACLR) degradation.

According to various aspects described herein, the wireless communication device (e.g., a UE, a base station) may have an apparatus (e.g., controller) that aligns the non-linearity between the chains that are driven by the same digital port. The controller may adjust $P_{out}$ or $P_{sat}$ for one or more transmit chains to adjust the ratio between $P_{out}$ and $P_{sat}$ so as to align the ratios of the multiple transmit chains. By adjusting powers to align the ratios of the multiple transmit chains, the NL characteristics may be managed more consistently across the transmit chains, improving performance of the transmitter.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

While aspects may be described herein using terminology commonly associated with a 5G or New Radio (NR) radio access technology (RAT), aspects of the present disclosure can be applied to other RATs, such as a 3G RAT, a 4G RAT, and/or a RAT subsequent to 5G (e.g., 6G).

FIG. 1 is a diagram illustrating an example of a wireless network 100, in accordance with the present disclosure. The wireless network 100 may be or may include elements of a 5G (e.g., NR) network and/or a 4G (e.g., Long Term Evolution (LTE)) network, among other examples. The wireless network 100 may include a user equipment (UE) 120 or multiple UEs 120 (shown as a UE 120a, a UE 120b, a UE 120c, a UE 120d, and a UE 120e). The wireless network 100 may also include one or more network entities, such as base stations 110 (shown as a BS 110a, a BS 110b, a BS 110c, and a BS 110d), and/or other network entities. A base station 110 is a network entity that communicates with UEs 120. A base station 110 (sometimes referred to as a BS) may include, for example, an NR base station, an LTE base station, a Node B, an eNB (e.g., in 4G), a gNB (e.g., in 5G), an access point, and/or a transmission reception point (TRP). Each base station 110 may provide communication coverage for a particular geographic area. In the Third Generation Partnership Project (3GPP), the term "cell" can refer to a coverage area of a base station 110 and/or a base station subsystem serving this coverage area, depending on the context in which the term is used.

A base station 110 may provide communication coverage for a macro cell, a pico cell, a femto cell, and/or another type of cell. A macro cell may cover a relatively large geographic area (e.g., several kilometers in radius) and may allow unrestricted access by UEs 120 with service subscriptions. A pico cell may cover a relatively small geographic area and may allow unrestricted access by UEs 120 with service subscription. A femto cell may cover a relatively small geographic area (e.g., a home) and may allow restricted access by UEs 120 having association with the femto cell (e.g., UEs 120 in a closed subscriber group (CSG)). A base station 110 for a macro cell may be referred to as a macro base station. A base station 110 for a pico cell may be referred to as a pico base station. A base station 110 for a femto cell may be referred to as a femto base station or an in-home base station. In the example shown in FIG. 1, the BS 110*a* may be a macro base station for a macro cell 102*a*, the BS 110*b* may be a pico base station for a pico cell 102*b*, and the BS 110*c* may be a femto base station for a femto cell 102*c*. A base station may support one or multiple (e.g., three) cells.

In some examples, a cell may not necessarily be stationary, and the geographic area of the cell may move according to the location of a base station 110 that is mobile (e.g., a mobile base station). In some examples, the base stations 110 may be interconnected to one another and/or to one or more other base stations 110 or network entities in the wireless network 100 through various types of backhaul interfaces, such as a direct physical connection or a virtual network, using any suitable transport network.

In some aspects, the term "base station" (e.g., the base station 110) or "network entity" may refer to an aggregated base station, a disaggregated base station, an integrated access and backhaul (IAB) node, a relay node, and/or one or more components thereof. For example, in some aspects, "base station" or "network entity" may refer to a central unit (CU), a distributed unit (DU), a radio unit (RU), a Near-Real Time (Near-RT) RAN Intelligent Controller (RIC), or a Non-Real Time (Non-RT) RIC, or a combination thereof. In some aspects, the term "base station" or "network entity" may refer to one device configured to perform one or more functions, such as those described herein in connection with the base station 110. In some aspects, the term "base station" or "network entity" may refer to a plurality of devices configured to perform the one or more functions. For example, in some distributed systems, each of a number of different devices (which may be located in the same geographic location or in different geographic locations) may be configured to perform at least a portion of a function, or to duplicate performance of at least a portion of the function, and the term "base station" or "network entity" may refer to any one or more of those different devices. In some aspects, the term "base station" or "network entity" may refer to one or more virtual base stations and/or one or more virtual base station functions. For example, in some aspects, two or more base station functions may be instantiated on a single device. In some aspects, the term "base station" or "network entity" may refer to one of the base station functions and not another. In this way, a single device may include more than one base station.

The wireless network 100 may include one or more relay stations. A relay station is a network entity that can receive a transmission of data from an upstream station (e.g., a network entity or a UE 120) and send a transmission of the data to a downstream station (e.g., a UE 120 or a network entity). A relay station may be a UE 120 that can relay transmissions for other UEs 120. In the example shown in FIG. 1, the BS 110*d* (e.g., a relay base station) may communicate with the BS 110*a* (e.g., a macro base station) and the UE 120*d* in order to facilitate communication between the BS 110*a* and the UE 120*d*. A base station 110 that relays communications may be referred to as a relay station, a relay base station, a relay, or the like.

The wireless network 100 may be a heterogeneous network with network entities that include different types of BSs, such as macro base stations, pico base stations, femto base stations, relay base stations, or the like. These different types of base stations 110 may have different transmit power levels, different coverage areas, and/or different impacts on interference in the wireless network 100. For example, macro base stations may have a high transmit power level (e.g., 5 to 40 watts) whereas pico base stations, femto base stations, and relay base stations may have lower transmit power levels (e.g., 0.1 to 2 watts).

A network controller 130 may couple to or communicate with a set of network entities and may provide coordination and control for these network entities. The network controller 130 may communicate with the base stations 110 via a backhaul communication link. The network entities may communicate with one another directly or indirectly via a wireless or wireline backhaul communication link.

The UEs 120 may be dispersed throughout the wireless network 100, and each UE 120 may be stationary or mobile. A UE 120 may include, for example, an access terminal, a terminal, a mobile station, and/or a subscriber unit. A UE 120 may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device, a biometric device, a wearable device (e.g., a smart watch, smart clothing, smart glasses, a smart wristband, smart jewelry (e.g., a smart ring or a smart bracelet)), an entertainment device (e.g., a music device, a video device, and/or a satellite radio), a vehicular component or sensor, a smart meter/sensor, industrial manufacturing equipment, a global positioning system device, and/or any other suitable device that is configured to communicate via a wireless medium.

Some UEs 120 may be considered machine-type communication (MTC) or evolved or enhanced machine-type communication (eMTC) UEs. An MTC UE and/or an eMTC UE may include, for example, a robot, a drone, a remote device, a sensor, a meter, a monitor, and/or a location tag, that may communicate with a network entity, another device (e.g., a remote device), or some other entity. Some UEs 120 may be considered Internet-of-Things (IoT) devices, and/or may be implemented as NB-IoT (narrowband IoT) devices. Some UEs 120 may be considered a Customer Premises Equipment. A UE 120 may be included inside a housing that houses components of the UE 120, such as processor components and/or memory components. In some examples, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks 100 may be deployed in a given geographic area. Each wireless network 100 may support a particular RAT and may operate on one or more frequencies. A RAT may be referred to as a radio technology, an air interface, or the like. A frequency may be referred to as a carrier, a frequency channel, or the like. Each frequency may support a single RAT in a given geographic area in order to avoid interference between wireless networks of different RATs. In some cases, NR or 5G RAT networks may be deployed.

In some examples, two or more UEs 120 (e.g., shown as UE 120*a* and UE 120*e*) may communicate directly using one or more sidelink channels (e.g., without using a network entity as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, or a vehicleto-pedestrian (V2P) protocol), and/or a mesh network. In such examples, a UE 120 may perform scheduling operations, resource selection operations, and/or other operations described elsewhere herein as being performed by the base station 110.

Devices of the wireless network 100 may communicate using the electromagnetic spectrum, which may be subdivided by frequency or wavelength into various classes, bands, channels, or the like. For example, devices of the wireless network 100 may communicate using one or more operating bands. In 5G NR, two initial operating bands have been identified as frequency range designations FR1 (410 MHz-7.125 GHz) and FR2 (24.25 GHz-52.6 GHz). It should be understood that although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above examples in mind, unless specifically stated otherwise, it should be understood that the term "sub-6 GHz" or the like, if used herein, may broadly represent frequencies that may be less than 6 GHz, may be within FR1, or may include mid-band frequencies. Further, unless specifically stated otherwise, it should be understood that the term "millimeter wave" or the like, if used herein, may broadly represent frequencies that may include mid-band frequencies, may be within FR2, FR4, FR4-a or FR4-1, and/or FR5, or may be within the EHF band. It is contemplated that the frequencies included in these operating bands (e.g., FR1, FR2, FR3, FR4, FR4-a, FR4-1, and/or FR5) may be modified, and techniques described herein are applicable to those modified frequency ranges.

In some aspects, an apparatus of a wireless communication device (e.g., a UE 120, base station 110, a network entity) may include a communication manager 140 or 150. As described in more detail elsewhere herein, the communication manager 140 or 150 may obtain, from a digital port, a signal before amplification and transmission on at least a first transmit chain for first antenna elements of the wireless communication device and a second transmit chain for second antenna elements of the wireless communication device. The communication manager 140 or 150 may adjust an amplification saturated power for the signal for the first transmit chain such that a first ratio of amplification saturated power to amplification output power of the first transmit chain aligns with a second ratio of amplification saturated power to amplification output power of the second transmit chain. The communication manager or 150 may transmit the signal in association with wireless communication.

In some aspects, communication manager 140 or 150 may obtain, from a digital port, a signal before amplification and transmission on at least a first transmit chain for first antenna elements of the wireless communication device and a second transmit chain for second antenna elements of the wireless communication device. The communication manager 140 or 150 may adjust an amplification output power for the signal for the first transmit chain such that a first ratio of amplification saturated power to amplification output power of the first transmit chain aligns with a second ratio of amplification saturated power to amplification output power of the second transmit chain. The communication manager 140 or 150 may transmit the signal in association with wireless communication. Additionally, or alternatively, the communication manager 140 or 150 may perform one or more other operations described herein.

As indicated above, FIG. 1 is provided as an example. Other examples may differ from what is described with regard to FIG. 1.

Figure 2:
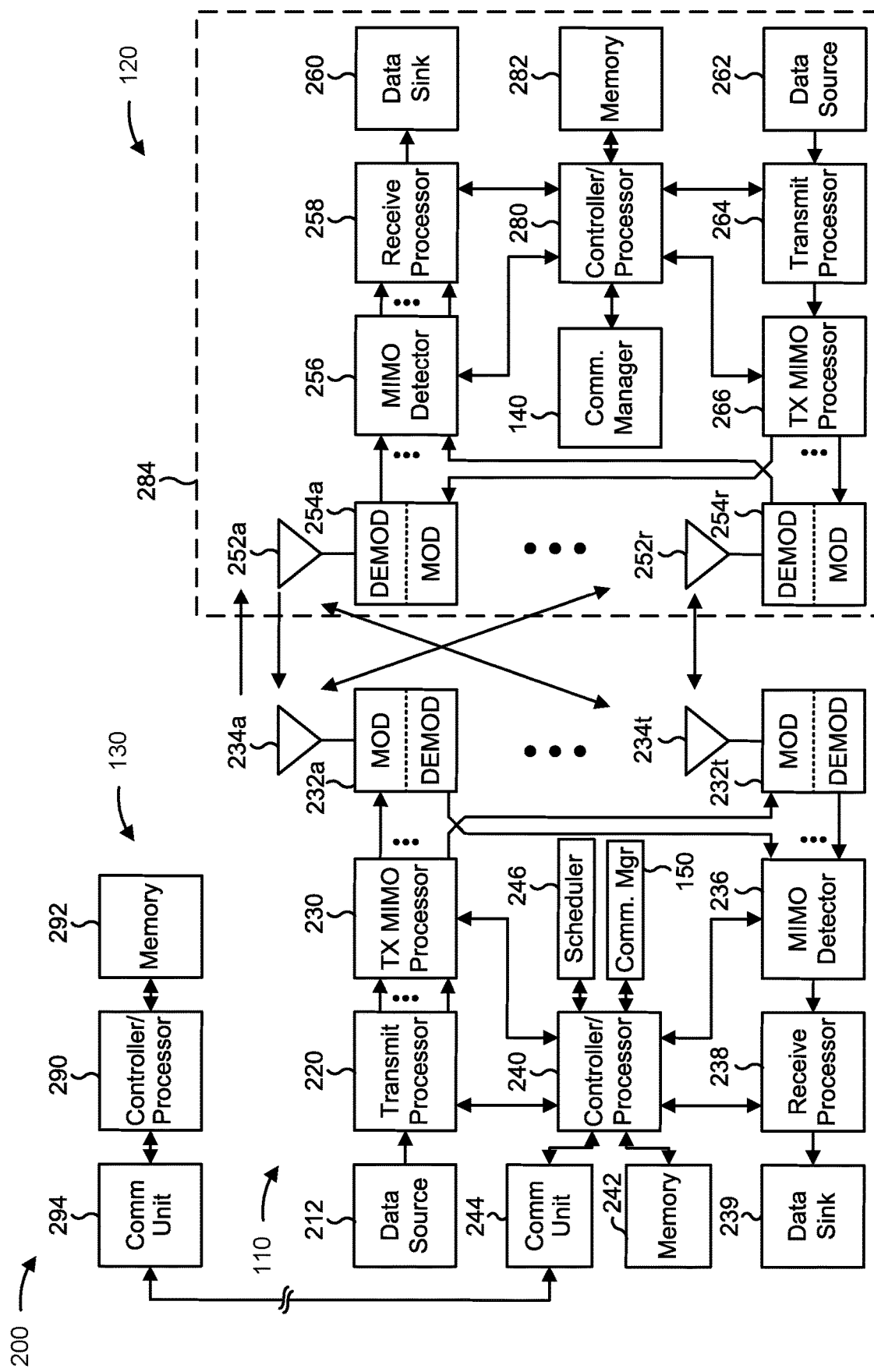
FIG. 2 is a diagram illustrating an example of a network entity in communication with a user equipment (UE) in a wireless network, in accordance with the present disclosure.

FIG. 2 is a diagram illustrating an example 200 of a network entity (e.g., base station 110) in communication with a UE 120 in a wireless network 100, in accordance with the present disclosure. The base station 110 may be equipped with a set of antennas 234a through 234t, such as T antennas (T≥1). The UE 120 may be equipped with a set of antennas 252a through 252r, such as R antennas (R≥1).

At the base station 110, a transmit processor 220 may receive data, from a data source 212, intended for the UE 120 (or a set of UEs 120). The transmit processor 220 may select one or more modulation and coding schemes (MCSs) for the UE 120 based at least in part on one or more channel quality indicators (CQIs) received from that UE 120. The base station 110 may process (e.g., encode and modulate) the data for the UE 120 based at least in part on the MCS(s) selected for the UE 120 and may provide data symbols for the UE 120. The transmit processor 220 may process system information (e.g., for semi-static resource partitioning information (SRPI)) and control information (e.g., CQI requests, grants, and/or upper layer signaling) and provide overhead symbols and control symbols. The transmit processor 220 may generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide a set of output symbol streams (e.g., T output symbol streams) to a corresponding set of modems 232 (e.g., T modems), shown as modems 232a through 232t. For example, each output symbol stream may be provided to a modulator component (shown as MOD) of a modem 232. Each modem 232 may use a respective modulator component to process a respective output symbol stream (e.g., for OFDM) to obtain an output sample stream. Each modem 232 may further use a respective modulator component to process (e.g., convert to analog, amplify, filter, and/or upconvert) the output sample stream to obtain a downlink signal. The modems 232a through 232t may transmit a set of downlink signals (e.g., T downlink signals) via a corresponding set of antennas 234 (e.g., T antennas), shown as antennas 234a through 234t.

At the UE 120, a set of antennas 252 (shown as antennas 252*a* through 252*r*) may receive the downlink signals from the base station 110 and/or other base stations 110 and may provide a set of received signals (e.g., R received signals) to a set of modems 254 (e.g., R modems), shown as modems 254*a* through 254*r*. For example, each received signal may be provided to a demodulator component (shown as DEMOD) of a modem 254. Each modem 254 may use a respective demodulator component to condition (e.g., filter, amplify, downconvert, and/or digitize) a received signal to obtain input samples. Each modem 254 may use a demodulator component to further process the input samples (e.g., for OFDM) to obtain received symbols. A MIMO detector 256 may obtain received symbols from the modems 254, may perform MIMO detection on the received symbols if applicable, and may provide detected symbols. A receive processor 258 may process (e.g., demodulate and decode) the detected symbols, may provide decoded data for the UE 120 to a data sink 260, and may provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some examples, one or more components of the UE 120 may be included in a housing 284.

The network controller 130 may include a communication unit 294, a controller/processor 290, and a memory 292. The network controller 130 may include, for example, one or more devices in a core network. The network controller 130 may communicate with the network entity via the communication unit 294.

One or more antennas (e.g., antennas 234*a* through 234*t* and/or antennas 252*a* through 252*r*) may include, or may be included within, one or more antenna panels, one or more antenna groups, one or more sets of antenna elements, and/or one or more antenna arrays, among other examples. An antenna panel, an antenna group, a set of antenna elements, and/or an antenna array may include one or more antenna elements (within a single housing or multiple housings), a set of coplanar antenna elements, a set of non-coplanar antenna elements, and/or one or more antenna elements coupled to one or more transmission and/or reception components, such as one or more components of FIG. 2.

On the uplink, at the UE 120, a transmit processor 264 may receive and process data from a data source 262 and control information (e.g., for reports that include RSRP, RSSI, RSRQ, and/or CQI) from the controller/processor 280. The transmit processor 264 may generate reference symbols for one or more reference signals. The symbols from the transmit processor 264 may be precoded by a TX MIMO processor 266 if applicable, further processed by the modems 254 (e.g., for DFT-s-OFDM or CP-OFDM), and transmitted to the network entity. In some examples, the modem 254 of the UE 120 may include a modulator and a demodulator. In some examples, the UE 120 includes a transceiver. The transceiver may include any combination of the antenna(s) 252, the modem(s) 254, the MIMO detector 256, the receive processor 258, the transmit processor 264, and/or the TX MIMO processor 266. The transceiver may be used by a processor (e.g., the controller/processor 280) and the memory 282 to perform aspects of any of the methods described herein (e.g., with reference to FIGS. 4-9).

At the network entity (e.g., base station 110), the uplink signals from UE 120 and/or other UEs may be received by the antennas 234, processed by the modem 232 (e.g., a demodulator component, shown as DEMOD, of the modem 232), detected by a MIMO detector 236 if applicable, and further processed by a receive processor 238 to obtain decoded data and control information sent by the UE 120. The receive processor 238 may provide the decoded data to a data sink 239 and provide the decoded control information to the controller/processor 240. The network entity may include a communication unit 244 and may communicate with the network controller 130 via the communication unit 244. The network entity may include a scheduler 246 to schedule one or more UEs 120 for downlink and/or uplink communications. In some examples, the modem 232 of the network entity may include a modulator and a demodulator. In some examples, the network entity includes a transceiver. The transceiver may include any combination of the antenna(s) 234, the modem(s) 232, the MIMO detector 236, the receive processor 238, the transmit processor 220, and/or the TX MIMO processor 230. The transceiver may be used by a processor (e.g., the controller/processor 240) and the memory 242 to perform aspects of any of the methods described herein (e.g., with reference to FIGS. 4-9).

A controller/processor of a network entity (e.g., the controller/processor 240 of the base station 110), the controller/processor 280 of the UE 120, and/or any other component(s) of FIG. 2 may perform one or more techniques associated with adjusting power to align transmit chain power ratios, as described in more detail elsewhere herein. In some aspects, the wireless communication device described herein is the UE 120, is included in the UE 120, or includes one or more components of the UE 120 shown in FIG. 2. In some aspects, the wireless communication device described herein is a network entity, is included in a network entity, or includes one or more components of the base station 110 shown in FIG. 2. For example, the controller/processor 240 of the base station 110, the controller/processor 280 of the UE 120, and/or any other component(s) of FIG. 2 may perform or direct operations of, for example, method 600 of FIG. 6, method 700 of FIG. 7, and/or other processes as described herein. The memory 242 and the memory 282 may store data and program codes for the network entity and the UE 120, respectively. In some examples, the memory 242 and/or the memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the network entity and/or the UE 120, may cause the one or more processors, the UE 120, and/or the network entity to perform or direct operations of, for example, method 600 of FIG. 6, method 700 of FIG. 7, and/or other processes as described herein. In some examples, executing instructions may include running the instructions, converting the instructions, compiling the instructions, and/or interpreting the instructions, among other examples.

In some aspects, an apparatus of a wireless communication device (e.g., a UE 120, base station 110, a network entity) includes means for obtaining, from a digital port, a signal before amplification and transmission on at least a first transmit chain for first antenna elements of the wireless communication device and a second transmit chain for second antenna elements of the wireless communication device; means for adjusting an amplification saturated power for the signal for the first transmit chain such that a first ratio of amplification saturated power to amplification output power of the first transmit chain aligns with a second ratio of amplification saturated power to amplification output power of the second transmit chain; and/or means for transmitting the signal in association with wireless communication. In some aspects, the means for the apparatus to perform operations described herein may include, for example, one or more of communication manager 150, transmit processor 220, TX MIMO processor 230, modem 232, antenna 234, MIMO detector 236, receive processor 238, controller/processor 240, memory 242, or scheduler 246. In some aspects, the means for the apparatus to perform operations described herein may include, for example, one or more of communication manager 140, antenna 252, modem 254, MIMO detector 256, receive processor 258, transmit processor 264, TX MIMO processor 266, controller/processor 280, or memory 282.

In some aspects, the apparatus includes means for obtaining, from a digital port, a signal before amplification and transmission on at least a first transmit chain for first antenna elements of the wireless communication device and a second transmit chain for second antenna elements of the wireless communication device; means for adjusting an amplification output power for the signal for the first transmit chain such that a first ratio of amplification saturated power to amplification output power of the first transmit chain aligns with a second ratio of amplification saturated power to amplification output power of the second transmit chain; and/or means for transmitting the signal in association with wireless communication.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of the controller/processor 280.

As indicated above, FIG. 2 is provided as an example. Other examples may differ from what is described with regard to FIG. 2.

Figure 3:
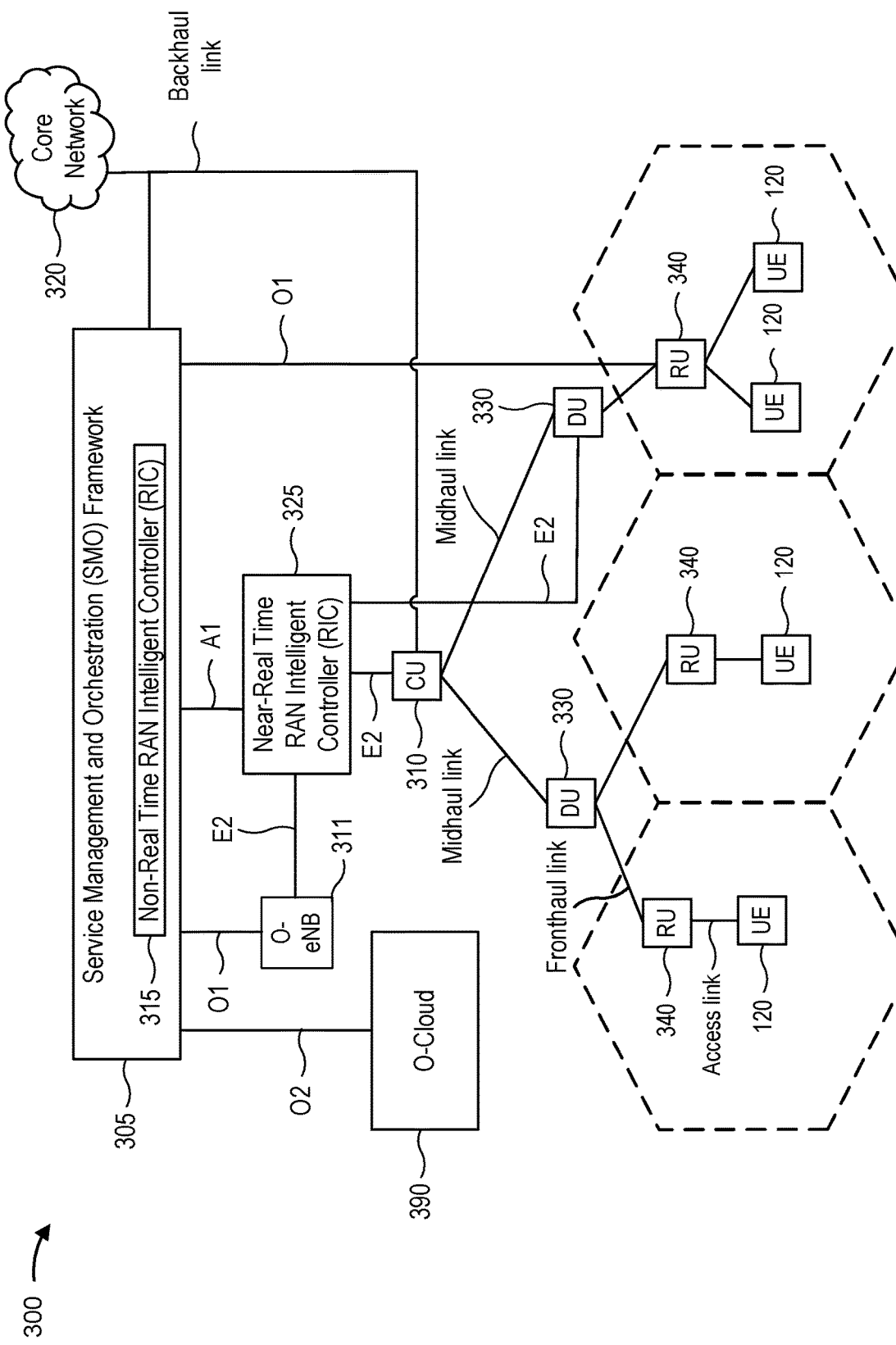
FIG. 3 is a diagram illustrating an example of a disaggregated base station, in accordance with the present disclosure.

FIG. 3 is a diagram illustrating an example of a disaggregated base station 300, in accordance with the present disclosure.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station, or one or more units (or one or more components) performing base station functionality, may be implemented in an aggregated or disaggregated architecture. For example, a BS (such as a Node B, evolved NB (eNB), NR BS, 5G NB, access point (AP), a TRP, or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more CUs, one or more DUs, or one or more RUs). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU, and RU also can be implemented as virtual units (e.g., a virtual central unit (VCU), a virtual distributed unit (VDU), or a virtual radio unit (VRU)).

Base station-type operation or network design may consider aggregation characteristics of base station functionality. For example, disaggregated base stations may be utilized in an IAB network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

The disaggregated base station 300 architecture may include one or more CUs 310 that can communicate directly with a core network 320 via a backhaul link, or indirectly with the core network 320 through one or more disaggregated base station units (such as a Near-RT RIC 325 via an E2 link, or a Non-RT RIC 315 associated with a Service Management and Orchestration (SMO) Framework 305, or both). A CU 310 may communicate with one or more DUs 330 via respective midhaul links, such as an F1 interface. The DUs 330 may communicate with one or more RUs 340 via respective fronthaul links. The fronthaul link, the midhaul link, and the backhaul link may be generally referred to as "communication links." The RUs 340 may communicate with respective UEs 120 via one or more RF access links. In some aspects, the UE 120 may be simultaneously served by multiple RUs 340. The DUs 330 and the RUs 340 may also be referred to as "O-RAN DUs (O-DUs")" and "O-RAN RUs (O-RUs)", respectively. A network entity may include a CU, a DU, an RU, or any combination of CUs, DUs, and RUs. A network entity may include a disaggregated base station or one or more components of the disaggregated base station, such as a CU, a DU, an RU, or any combination of CUs, DUs, and RUs. A network entity may also include one or more of a TRP, a relay station, a passive device, an intelligent reflective surface (IRS), or other components that may provide a network interface for or serve a UE, mobile station, sensor/actuator, or other wireless device.

Each of the units (e.g., the CUs 310, the DUs 330, the RUs 340, as well as the Near-RT RICs 325, the Non-RT RICs 315 and the SMO Framework 305) may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as an RF transceiver), configured to receive or transmit signals, or both, over a wireless transmission medium to one or more of the other units.

In some aspects, the CU 310 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 310. The CU 310 may be configured to handle user plane functionality (i.e., Central Unit—User Plane (CU-UP)), control plane functionality (i.e., Central Unit—Control Plane (CU-CP)), or a combination thereof. In some implementations, the CU 310 can be logically split into one or more CU-UP units and one or more CU-CP units. The CU-UP unit can communicate bidirectionally with the CU-CP unit via an interface, such as the E1 interface when implemented in an O-RAN configuration. The CU 310 can be implemented to communicate with the DU 330, as necessary, for network control and signaling.

The DU 330 may correspond to a logical unit that includes one or more base station functions to control the operation of one or more RUs 340. In some aspects, the DU 330 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3GPP. In some aspects, the DU 330 may further host one or more low PHY layers. Each layer (or module) can be implemented with an interface configured to communicate signals with other layers (and modules) hosted by the DU 330, or with the control functions hosted by the CU 310.

Lower-layer functionality can be implemented by one or more RUs 340. In some deployments, an RU 340, controlled by a DU 330, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 340 can be implemented to handle over the air (OTA) communication with one or more UEs 120. In some implementations, real-time and non-real-time aspects of control and user plane communication with the RU(s) 340 can be controlled by the corresponding DU 330. In some scenarios, this configuration can enable the DU(s) 330 and the CU 310 to be implemented in a cloud-based RAN architecture, such as a vRAN architecture.

The SMO Framework 305 may be configured to support RAN deployment and provisioning of non-virtualized and virtualized network elements. For non-virtualized network elements, the SMO Framework 305 may be configured to support the deployment of dedicated physical resources for RAN coverage requirements which may be managed via an operations and maintenance interface (such as an O1 interface). For virtualized network elements, the SMO Framework 305 may be configured to interact with a cloud computing platform (such as an open cloud (O-Cloud) 390) to perform network element life cycle management (such as to instantiate virtualized network elements) via a cloud computing platform interface (such as an O2 interface). Such virtualized network elements can include, but are not limited to, CUs 310, DUs 330, RUs 340 and Near-RT RICs 325. In some implementations, the SMO Framework 305 can communicate with a hardware aspect of a 4G RAN, such as an open eNB (O-eNB) 311, via an O1 interface. Additionally, in some implementations, the SMO Framework 305 can communicate directly with one or more RUs 340 via an O1 interface. The SMO Framework 305 also may include a Non-RT RIC 315 configured to support functionality of the SMO Framework 305.

The Non-RT RIC 315 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 325. The Non-RT RIC 315 may be coupled to or communicate with (such as via an A1 interface) the Near-RT RIC 325. The Near-RT RIC 325 may be configured to include a logical function that enables near-real-time control and optimization of RAN elements and resources via data collection and actions over an interface (such as via an E2 interface) connecting one or more CUs 310, one or more DUs 330, or both, as well as an O-eNB, with the Near-RT RIC 325.

In some implementations, to generate AI/ML models to be deployed in the Near-RT RIC 325, the Non-RT RIC 315 may receive parameters or external enrichment information from external servers. Such information may be utilized by the Near-RT RIC 325 and may be received at the SMO Framework 305 or the Non-RT RIC 315 from non-network data sources or from network functions. In some examples, the Non-RT RIC 315 or the Near-RT RIC 325 may be configured to tune RAN behavior or performance. For example, the Non-RT RIC 315 may monitor long-term trends and patterns for performance and employ AI/ML models to perform corrective actions through the SMO Framework 305 (such as reconfiguration via O1) or via creation of RAN management policies (such as A1 policies).

As indicated above, FIG. 3 is provided as an example. Other examples may differ from what is described with regard to FIG. 3.

Figure 4:
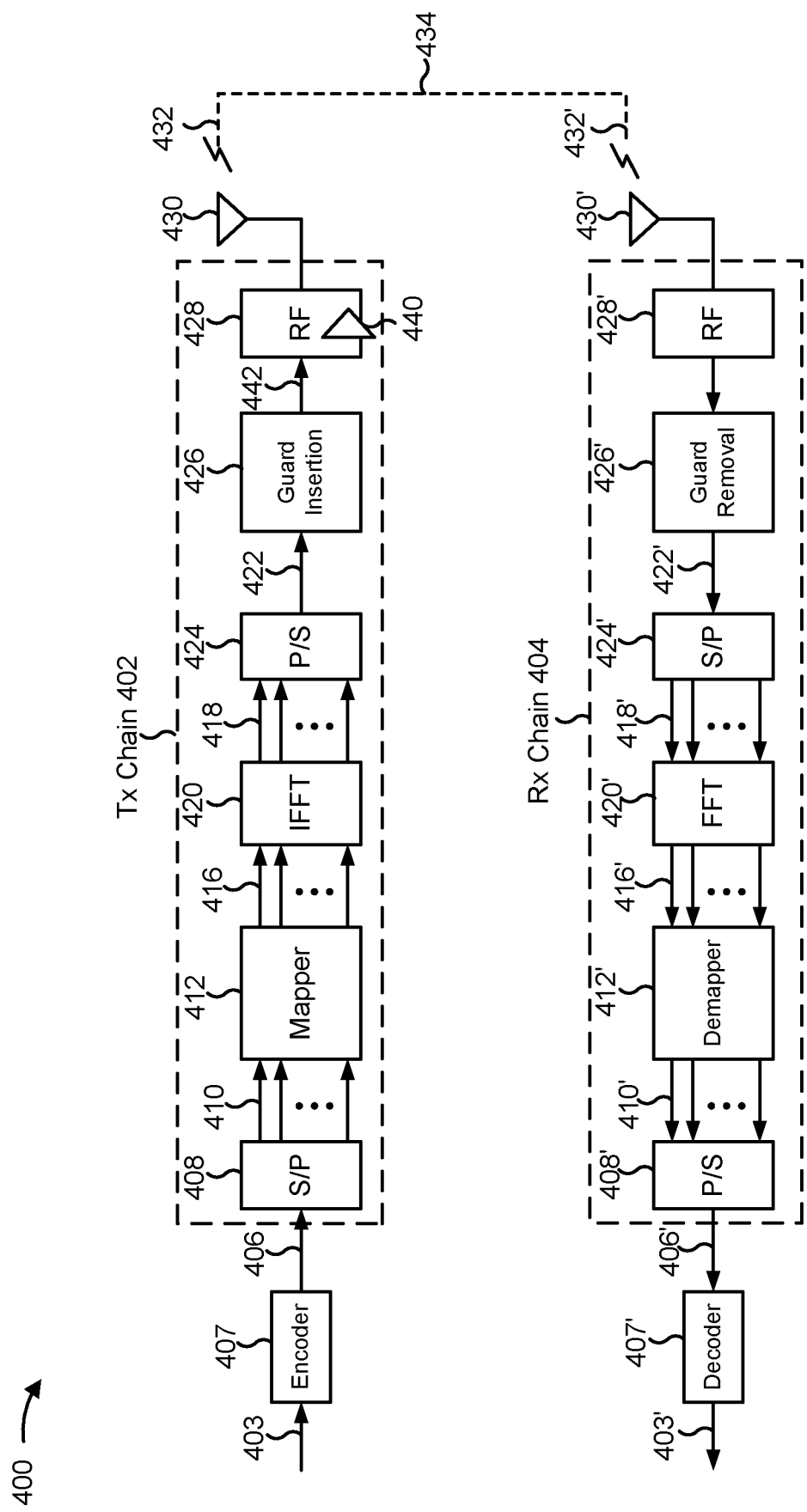
FIG. 4 is a diagram illustrating an example of a transmit (Tx) chain and a receive (Rx) chain of a UE, in accordance with the present disclosure.

FIG. 4 is a diagram illustrating an example 400 of a transmit (Tx) chain 402 and a receive (Rx) chain 404 of a UE 120, in accordance with the present disclosure. In some aspects, one or more components of Tx chain 402 may be implemented in transmit processor 264, TX MIMO processor 266, modem 254, and/or controller/processor 280, as described above in connection with FIG. 2. In some aspects, Tx chain 402 may be implemented in UE 120 for transmitting data 406 (e.g., uplink data, an uplink reference signal, and/or uplink control information) to base station 110 on an uplink channel.

An encoder 407 may alter a signal (e.g., a bitstream) 403 into data 406. Data 406 to be transmitted is provided from encoder 407 as input to a serial-to-parallel (S/P) converter 408. In some aspects, S/P converter 408 may split the transmission data into N parallel data streams 410.

The N parallel data streams 410 may then be provided as input to a mapper 412. Mapper 412 may map the N parallel data streams 410 onto N constellation points. The mapping may be done using a modulation constellation, such as binary phase-shift keying (BPSK), quadrature phase-shift keying (QPSK), 8 phase-shift keying (8PSK), quadrature amplitude modulation (QAM), etc. Thus, mapper 412 may output N parallel symbol streams 416, each symbol stream 416 corresponding to one of N orthogonal subcarriers of an inverse fast Fourier transform (IFFT) component 420. These N parallel symbol streams 416 are represented in the frequency domain and may be converted into N parallel time domain sample streams 418 by IFFT component 420.

In some aspects, N parallel modulations in the frequency domain correspond to N modulation symbols in the frequency domain, which are equal to N mapping and N-point IFFT in the frequency domain, which are equal to one (useful) OFDM symbol in the time domain, which are equal to N samples in the time domain. One OFDM symbol in the time domain, Ns, is equal to Ncp (the number of guard samples per OFDM symbol)+N (the number of useful samples per OFDM symbol).

The N parallel time domain sample streams 418 may be converted into an OFDM/OFDMA symbol stream 422 by a parallel-to-serial (P/S) converter 424. A guard insertion component 426 may insert a guard interval between successive OFDM/OFDMA symbols in the OFDM/OFDMA symbol stream 422. The output of guard insertion component 426 may then be upconverted to a desired transmit frequency band by a radio frequency (RF) front end 428. An antenna 430 may then transmit the resulting signal 432.

In some aspects, Rx chain 404 may utilize OFDM/OFDMA. In some aspects, one or more components of Rx chain 404 may be implemented in receive processor 258, MIMO detector 256, modem 254, and/or controller/processor 280, as described above in connection with FIG. 2. In some aspects, Rx chain 404 may be implemented in UE 120 for receiving data 406 (e.g., downlink data, a downlink reference signal, and/or downlink control information) from base station 110 on a downlink channel.

A transmitted signal 432 is shown traveling over a wireless channel 434 from Tx chain 402 to Rx chain 404. When a signal 432' is received by an antenna 430', the received signal 432' may be downconverted to a baseband signal by an RF front end 428'. A guard removal component 426' may then remove the guard interval that was inserted between OFDM/OFDMA symbols by guard insertion component 426.

The output of guard removal component 426' may be provided to an S/P converter 424'. The output may include an OFDM/OFDMA symbol stream 422', and S/P converter 424' may divide the OFDM/OFDMA symbol stream 422' into N parallel time-domain symbol streams 418', each of which corresponds to one of the N orthogonal subcarriers. An FFT component 420' may convert the N parallel time-domain symbol streams 418' into the frequency domain and output N parallel frequency-domain symbol streams 416'.

A demapper 412' may perform the inverse of the symbol mapping operation that was performed by mapper 412, thereby outputting N parallel data streams 410'. A P/S converter 408' may combine the N parallel data streams 410' into a single data stream 406'. Ideally, data stream 406' corresponds to data 406 that was provided as input to Tx chain 402. Data stream 406' may be decoded into a decoded data stream 403' by decoder 407'.

A transmitter of a wireless communication device may include non-linear components, such as high-power PAs with limited linear dynamic range. The non-linear characteristics of the components mean that a transmitted signal can be distorted due to variations at higher transmit powers that cause a high peak-to-average-power ratio (PAPR). The non-linear distortions may include in-band distortion, which affects the link performance. The transmit quality of a link can be measured as an EVM. The EVM may represent a sum of the distortions. The non-linear distortions may also include an out-band distortion, which dictates the amount of out of band (OOB) adjacent channel interference (ACI). The ACI Indicates how much the adjacent channel is "polluted" by the main transmission.

In order to avoid these distortions, a wireless communication device can use a power back-off (BO) technique. However, the power BO comes with a cost. The higher the power BO, the lower the power efficiency and the lower the power that is transmitted to the medium. An alternative or additional technique is to use a digital pre-distorter (DPD) in the transmitter's digital front end. Using the DPD, the amount of distortion is maintained at a target level, while the power BO is reduced to as low as possible. This can improve PA efficiency.

The front end 428 of example 400 may include a PA 440 and other components to control an amplification output power ($P_{out}$) of a signal 442 from a digital port (from signal 403 to become transmitted signal 432) up to a maximum output power for the PA 440. The maximum output power for the PA 440 may be referred to as an "amplification saturated power" or $P_{sat}$. The front end, or the transmit chain with the front end, may be associated with a ratio of $P_{out}$ to $P_{sat}$.

5G products may use hybrid analog and digital beamforming architecture in which a single digital port is driving multiple analog chains, such as Tx chain 402. Thus, a single DPD engine is applied to an array of PA elements and the assumption is that all of these chains experience the same non-linearity (NL) characteristics. However, this assumption does not hold accurately for several reasons.

In some transmitters, each digital port is connected to 128 antenna elements that are divided into 16 blasters. While the chains belonging to the same blaster have similar NL characteristics, different blasters can have different NL characteristics due to process variations, physical layout, and/or other reasons. Also, there can be temperature differences between the blasters, and this can cause additional NL differences between the chains. Amplitude tapering can be used for multi-user MIMO (MU-MIMO) to keep the spatial separation of components, but the tapering is implemented by adjusting gain prior to the PA. The NL differences can cause a ratio of the PA power in with respect to the PA power out ($P_{out}$) to be different (typically lower) while $P_{sat}$ remains the same. As a result, the chains with a lower $P_{out}$ will have better linearity than those with the higher $P_{out}$. In other words, different chains can have different NL characteristics and thus the single DPD engine solution may lead to EVM and/or ACLR degradation.

The number and arrangement of components shown in FIG. 4 are provided as an example. In practice, there may be additional components, fewer components, different components, or differently arranged components than those shown in FIG. 4. Furthermore, two or more components shown in FIG. 4 may be implemented within a single component, or a single component shown in FIG. 4 may be implemented as multiple, distributed components. Additionally, or alternatively, a set of components (e.g., one or more components) shown in FIG. 4 may perform one or more functions described as being performed by another set of components shown in FIG. 4.

Figure 5:
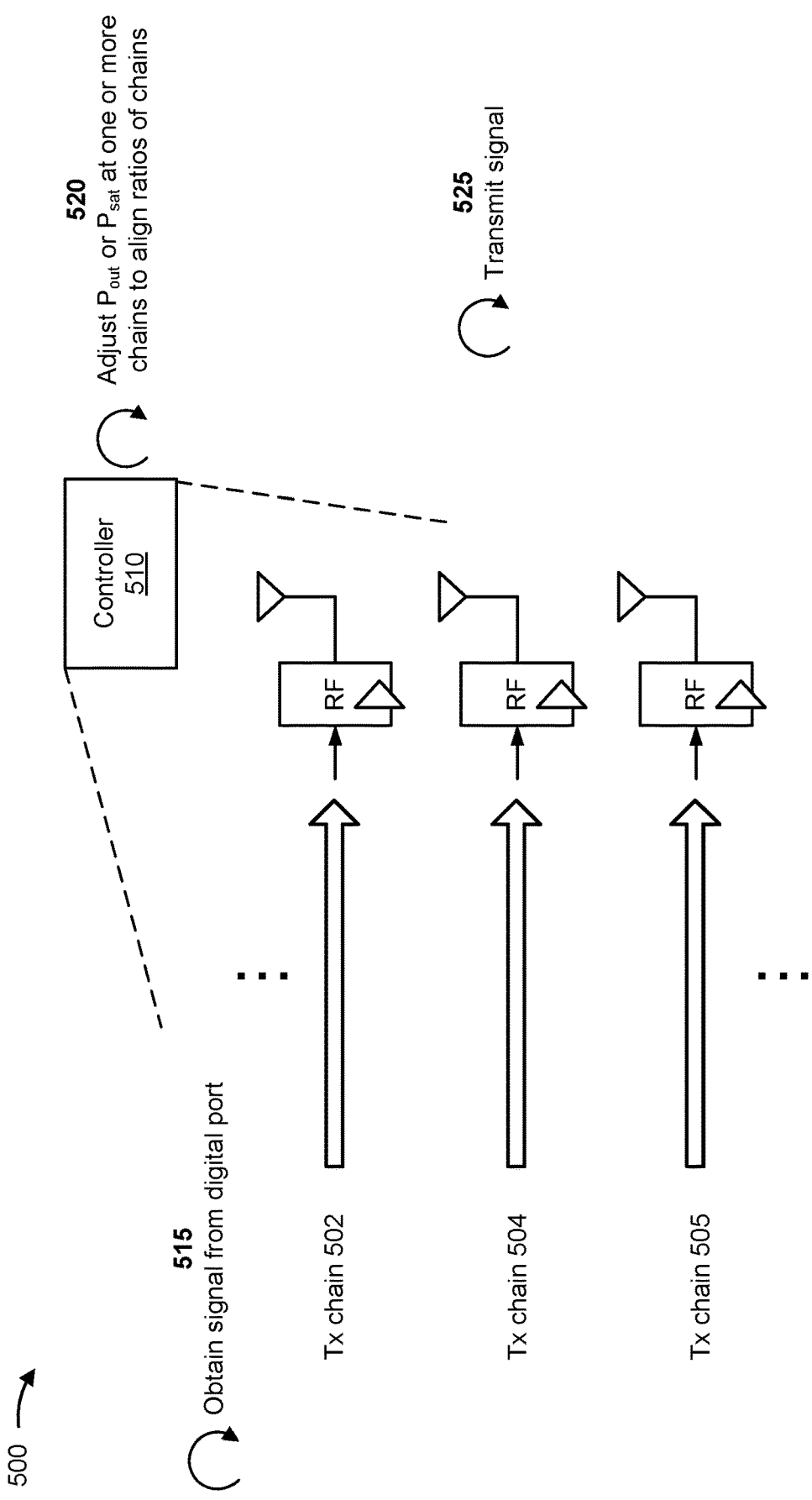
FIG. 5 is a diagram illustrating an example of aligning non-linearity of multiple transmit chains, in accordance with the present disclosure.

FIG. 5 is a diagram illustrating an example 500 of aligning non-linearity of multiple transmit chains, in accordance with the present disclosure. Example 500 shows a few transmit chains (Tx chain 502, Tx chain 504, Tx chain 506) of multiple transmit chains that share a digital port. Each of the transmit chains may support antenna elements, whether one antenna element or multiple antenna elements.

According to various aspects described herein, the wireless communication device (e.g., a UE 120, base station 110, a network entity) may have an apparatus (e.g., controller 510) that aligns the non-linearity between the chains that are driven by the same digital port. The controller 510 may include any combination of components described in connection with FIG. 2 and may control power amplification for the chains. At 515, the controller may obtain a signal, directly or indirectly, from a digital port. The signal may be obtained from the digital port at each respective Tx chain and may be obtained before amplification and transmission. At 520, the controller 510 may adjust a ratio between $P_{out}$ and $P_{sat}$ for one or more the chains such that the ratios align. This may include, for example, adjusting either $P_{out}$ and $P_{sat}$ for Tx chain 502 to align a ratio of Tx chain 502 with a ratio for Tx chain 504. The controller 510 may adjust either $P_{out}$ and $P_{sat}$ for Tx chain 502 and/or for either $P_{out}$ and $P_{sat}$ for Tx chain 504 to align the respective ratios with the ratio of Tx chain 506, and so forth. The controller 510 may adjust the ratios in any order or combination to align the ratios.

Ratios may be compared to each other, whether the ratio is $P_{out}/P_{sat}$ or $P_{sat}/P_{out}$. Aligning a first ratio with a second ratio may be equivalent to aligning the second ratio with the first ratio. In example 500, the ratio is $P_{sat}/P_{out}$. Two ratios may be aligned if both ratios satisfy (e.g., match or fall within) a threshold range of difference. For example, if a first ratio for Tx chain 502 is 1.3, the second ratio for Tx chain 504 is 1.4, then the absolute difference (1.4-1.3 or 1.3-1.4) is 0.1. If the threshold range is 0.2, then the first ratio is aligned with the second ratio, as 0.1 is less than 0.2. The threshold range may be satisfied if the difference is 0.2, which is equal to 0.2 (or not satisfied based on the configuration). By contrast, if the threshold range is 0.05, the threshold range is not satisfied. The threshold range may be configurable (e.g., via signaling from another component or device) or may be specified in stored configuration information.

In some aspects, the controller 510 may adjust $P_{out}$ of the chains such that the NL characteristics for the chains are the same. The controller 510, as part of $P_{out}$ equalization may adjust $P_{out}$ of all the chains such that $P_{out}$ is the same. This may help to control beam direction and shape. If different blasters have different $P_{sat}$, the controller 510 may have to adjust $P_{sat}$ to align $P_{sat}$ between all of the chains. However, to be more effective, the controller 510 may focus on aligning the ratios.

In some aspects, adjusting $P_{sat}$ for the signal for a chain includes adjusting power supply voltage (e.g., $V_{dd}$) for a PA of the chain. The controller 510 may adjust $P_{sat}$ for transmit chains to taper a beam formed for transmitting the signal. Tapering a beam may include reducing an amplitude of the beam and/or reducing the width of the beam.

In some aspects, the controller 510 may apply a pre-distortion operation on the signal before transmission. The pre-distortion operation may benefit from aligned ratios. The pre-distortion operation may be uniform for the transmit chains if the ratios are aligned. The controller 510 may adjust $P_{out}$ or $P_{sat}$ such that the ratios are aligned.

In some aspects, adjusting the $P_{out}$ includes adjusting a gain or a bias voltage for a PA of the chain. The controller 510 may also adjust $P_{sat}$ to set an effective isotropic radiated power (EIRP) while controlling power consumption. The power consumption may be direct current (DC) power consumption. In some aspects, the controller 510 may use a combined approach of adjusting $P_{sat}$ to optimize the EIRP under maximal power consumption constraint and adjusting $P_{out}$ to align the NL characteristics between all of the chains.

At 525, the controller 510 may transmit the signal. This may include transmitting the signal from the chains in association with wireless communication. The signal may include the signal obtained from the digital port and processed as appropriate through the chains.

By adjusting powers to align the ratios of multiple transmit chains of a transmitter, the NL characteristics may be managed more consistently across the transmit chains, improving performance of the transmitter. Aligning the ratios allows for constant DPD gains regardless of process, beam forming scheme, or other potential constraints.

The number and arrangement of components shown in FIG. 5 are provided as an example. In practice, there may be additional components, fewer components, different components, or differently arranged components than those shown in FIG. 5. Furthermore, two or more components shown in FIG. 5 may be implemented within a single component, or a single component shown in FIG. 5 may be implemented as multiple, distributed components. Additionally, or alternatively, a set of components (e.g., one or more components) shown in FIG. 5 may perform one or more functions described as being performed by another set of components shown in FIG. 5.

Figure 6:
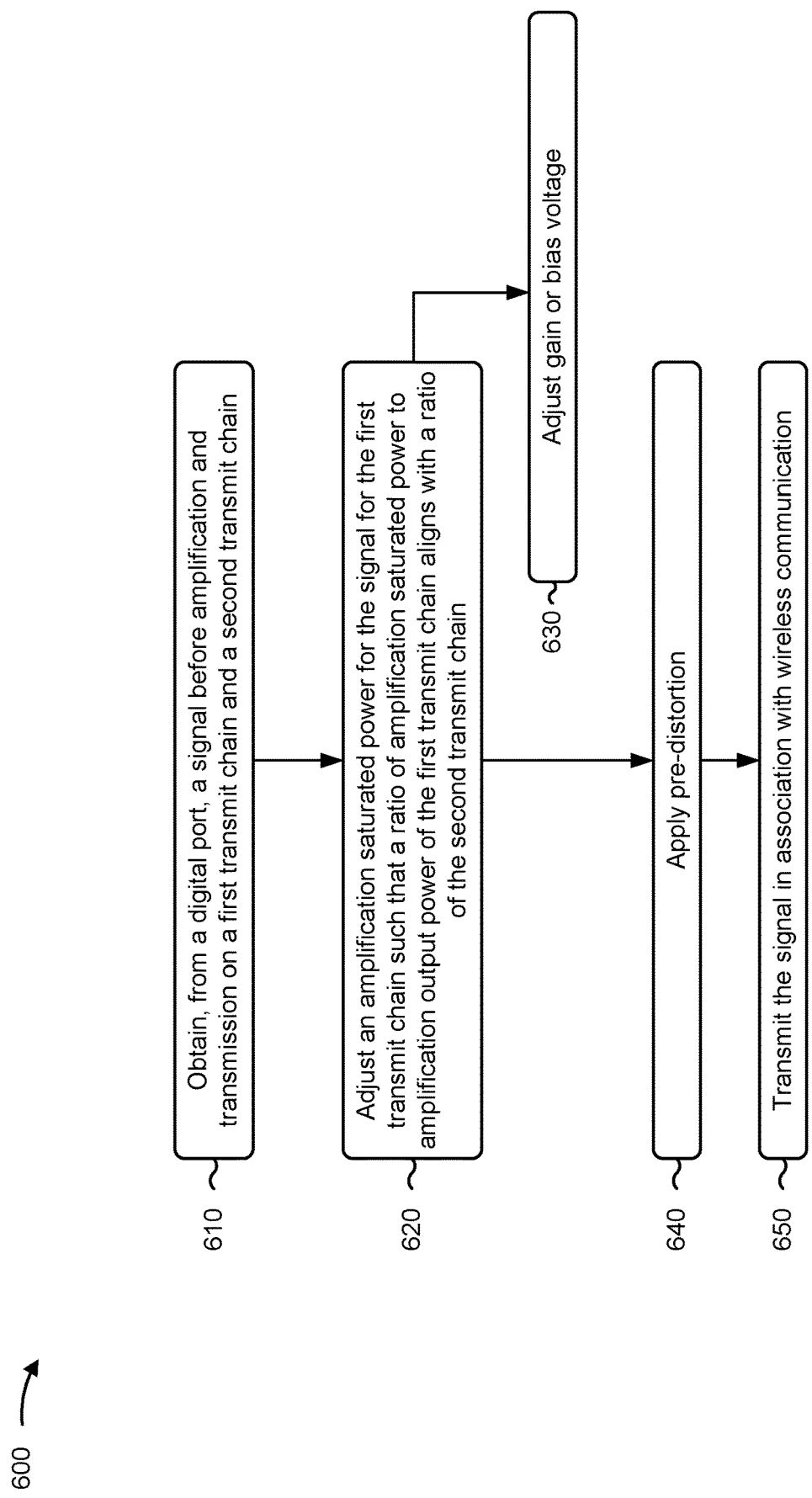
FIG. 6 is a flowchart of an example method of wireless communication, in accordance with the present disclosure.

FIG. 6 is a flowchart of an example method 600 of wireless communication. The method 600 may be performed by, for example, an apparatus (e.g., controller 510).

At 610, the apparatus may obtain a signal before amplification and transmission. The signal may be obtained directly or indirectly from a digital port from which multiple transmit chains obtain the signal. For example, the apparatus (e.g., using communication manager 808 and/or signal component 810 depicted in FIG. 8) may obtain, from the digital port, a signal before amplification and transmission on at least a first transmit chain (for first antenna elements) and a second transmit chain (for second antenna elements), as described above in connection with, for example, FIG. 4 and at FIG. 5.

At 620, the apparatus may adjust an amplification saturated power for the signal for the first transmit chain such that a ratio of amplification saturated power to amplification output power of the first transmit chain aligns with a ratio of the second transmit chain. For example, the apparatus (e.g., using communication manager 808 and/or adjustment component 812 depicted in FIG. 8) may adjust an amplification saturated power for the signal for the first transmit chain such that a ratio of the first transmit chain aligns with a ratio of the second transmit chain, as described above in connection with, for example, FIG. 4 and at FIG. 5. In some aspects, alone or in combination with one or more of the first and second aspects, method 600 includes adjusting the amplification saturated power for the first transmit chain and the amplification saturated power for the second transmit chain to taper a beam formed for transmitting the signal from the first antenna elements and the second antenna elements.

At 630, the apparatus may adjust the amplification saturated power for the signal for the first transmit chain by adjusting power supply voltage for a power amplifier for the first transmit chain. For example, the apparatus (e.g., using communication manager 808 and/or adjustment component 812 depicted in FIG. 8) may adjust power supply voltage for a power amplifier for the first transmit chain, as described above in connection with, for example, FIG. 4 and at FIG. 5.

At 640, the apparatus may apply a pre-distortion operation on the signal before transmission. For example, the apparatus (e.g., using communication manager 808 and/or adjustment component 812 depicted in FIG. 8) may apply a pre-distortion operation on the signal before transmission, as described above in connection with, for example, FIG. 4 and at FIG. 5.

At 650, the apparatus may transmit the signal in association with wireless communication. For example, the apparatus (e.g., using communication manager 808 and/or transmission component 804 depicted in FIG. 8) may transmit the signal in association with wireless communication, as described above in connection with, for example, FIG. 4 and at FIG. 5.

In some aspects, alone or in combination with one or more of the first through third aspects, the wireless communication device is a network entity. In some aspects, alone or in combination with one or more of the first through fourth aspects, the wireless communication device is a UE.

Although FIG. 6 shows example blocks of method 600, in some aspects, method 600 may include additional blocks, fewer blocks, different blocks, or differently arranged blocks than those depicted in FIG. 6. Additionally, or alternatively, two or more of the blocks of method 600 may be performed in parallel.

Figure 7:
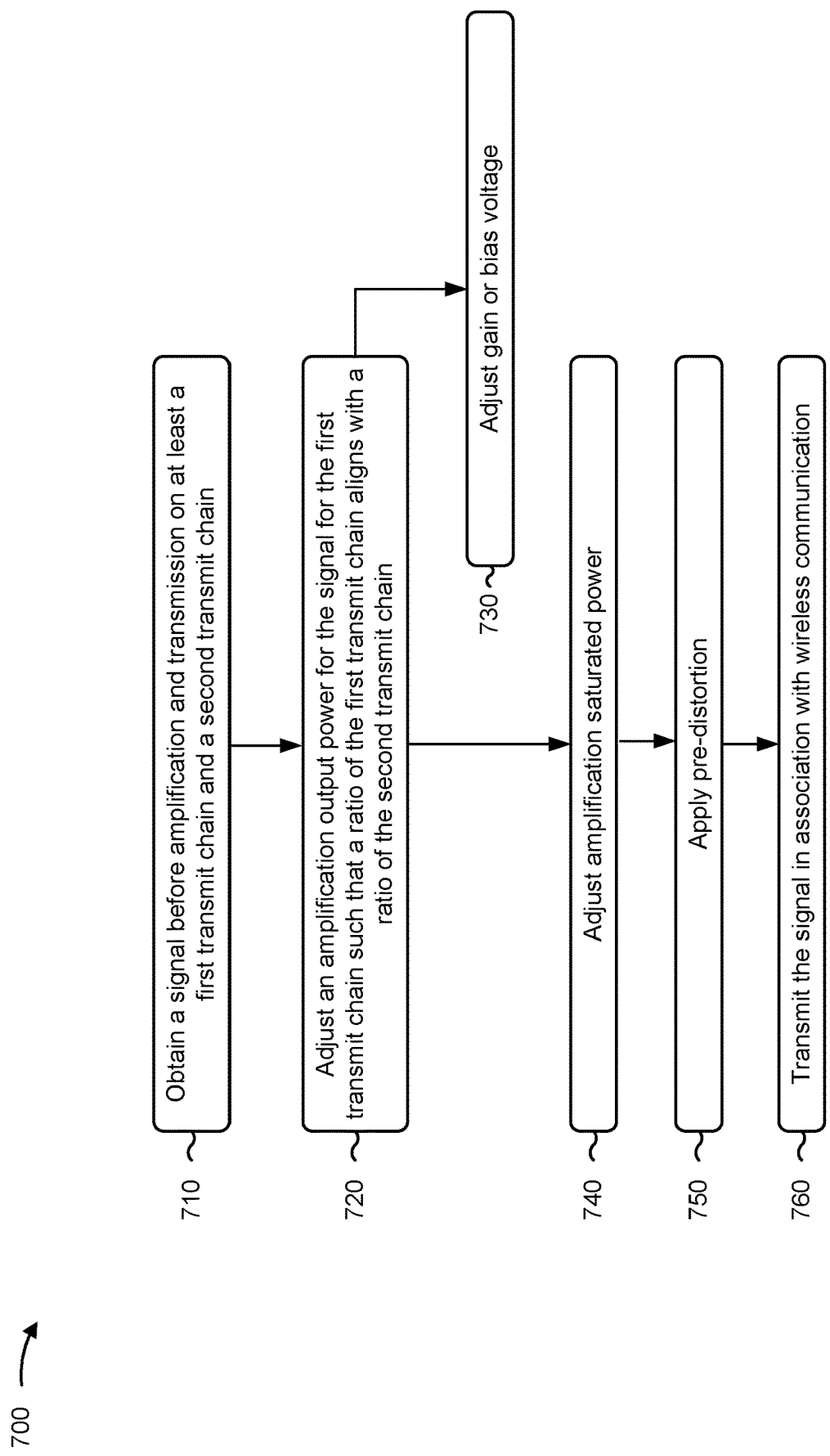
FIG. 7 is a flowchart of an example method of wireless communication, in accordance with the present disclosure.

FIG. 7 is a flowchart of an example method 700 of wireless communication. The method 700 may be performed by, for example, an apparatus (e.g., controller 510).

At 710, the apparatus may obtain, from a digital port, a signal before amplification and transmission. For example, the apparatus (e.g., using communication manager 808 and/or signal component 810 depicted in FIG. 8) may obtain a signal before amplification and transmission, as described above in connection with, for example, FIG. 4 and at FIG. 5.

At 720, the apparatus may adjust an amplification output power for the signal for the first transmit chain such that a ratio of the first transmit chain aligns with a ratio of the second transmit chain. For example, the apparatus (e.g., using communication manager 808 and/or adjustment component 812 depicted in FIG. 8) may adjust an amplification output power for the signal for the first transmit chain such that a ratio of the first transmit chain aligns with a ratio of the second transmit chain, as described above in connection with, for example, FIG. 4 and at FIG. 5.

At 730, the apparatus may adjust the amplification output power by adjusting a gain or a bias voltage for the first transmit chain. For example, the apparatus (e.g., using communication manager 808 and/or adjustment component 812 depicted in FIG. 8) may adjust the amplification output power by adjusting a gain or a bias voltage for the first transmit chain, as described above in connection with, for example, FIG. 4 and at FIG. 5.

At 740, the apparatus may apply a pre-distortion operation on the signal before transmission. For example, the apparatus (e.g., using communication manager 808 and/or adjustment component 812 depicted in FIG. 8) may apply a pre-distortion operation on the signal before transmission, as described above in connection with, for example, FIG. 4 and at FIG. 5.

At 750, the apparatus may adjust the amplification saturated power for the signal for the first transmit chain to set an EIRP while controlling power consumption or to help align ratios. For example, the apparatus (e.g., using communication manager 808 and/or adjustment component 812 depicted in FIG. 8) may adjust the amplification saturated power for the signal for the first transmit chain to set an EIRP while controlling power consumption or to help align ratios, as described above in connection with, for example, FIG. 4 and at FIG. 5.

At 760, the apparatus may transmit the signal in association with wireless communication. For example, the apparatus (e.g., using communication manager 808 and/or transmission component 804 depicted in FIG. 8) may transmit the signal in association with wireless communication, as described above in connection with, for example, FIG. 4 and at FIG. 5.

In some aspects, alone or in combination with one or more of the first through fourth aspects, the wireless communication device is a network entity. In some aspects, alone or in combination with one or more of the first through fifth aspects, the wireless communication device is a UE.

Although FIG. 7 shows example blocks of method 700, in some aspects, method 700 may include additional blocks, fewer blocks, different blocks, or differently arranged blocks than those depicted in FIG. 7. Additionally, or alternatively, two or more of the blocks of method 700 may be performed in parallel.

Figure 8:
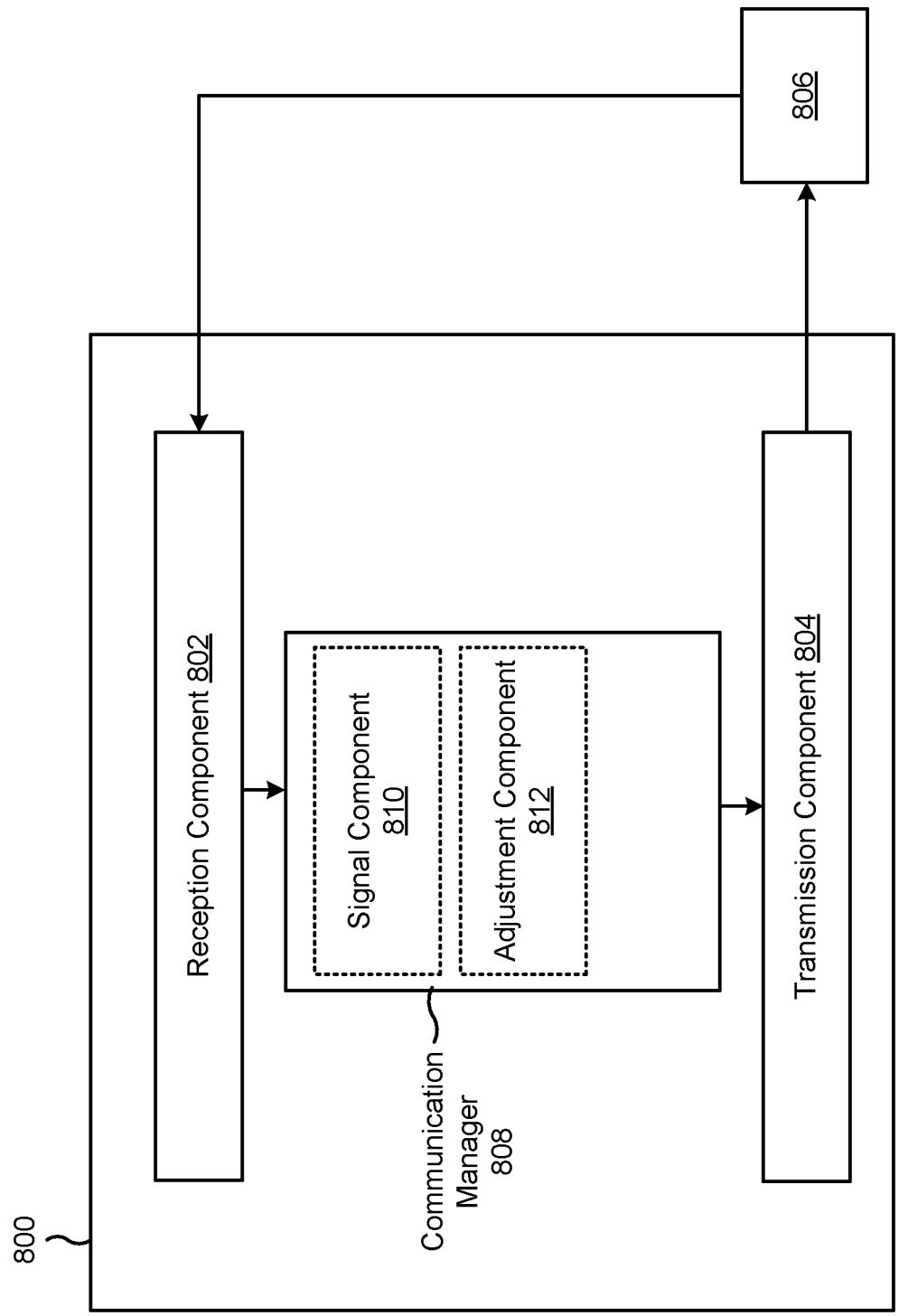
FIG. 8 is a diagram of an example apparatus for wireless communication, in accordance with the present disclosure.

FIG. 8 is a diagram of an example apparatus 800 for wireless communication. The apparatus 800 may be, or may be included in, a wireless communication device (e.g., a UE 120, base station 110, a network entity), or a wireless communication device may include the apparatus 800. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include the communication manager 808. The communication manager 808 may control and/or otherwise manage one or more operations of the reception component 802 and/or the transmission component 804. In some aspects, the communication manager 808 may include one or more antennas, a modem, a controller/processor, a memory, or a combination thereof, of the UE or base station described in connection with FIG. 2. The communication manager 808 may be, or be similar to, the communication manager 140 or 150 depicted in FIGS. 1 and 2. For example, in some aspects, the communication manager 808 may be configured to perform one or more of the functions described as being performed by the communication manager 140 or 150. In some aspects, the communication manager 808 may include the reception component 802 and/or the transmission component 804. The communication manager 808 may include a signal component 810 and/or an adjustment component 812, among other examples.

In some aspects, the apparatus 800 may be configured to perform one or more operations described herein in connection with FIGS. 1-5. Additionally, or alternatively, the apparatus 800 may be configured to perform one or more processes described herein, such as process 600 of FIG. 6, process 700 of FIG. 7. In some aspects, the apparatus 800 and/or one or more components shown in FIG. 8 may include one or more components of the wireless communication device described in connection with FIG. 2. Additionally, or alternatively, one or more components shown in FIG. 8 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 800. In some aspects, the reception component 802 may include one or more antennas, a modem, a demodulator, a MIMO detector, a receive processor, a controller/processor, a memory, or a combination thereof, of the wireless communication device described in connection with FIG. 2.

The transmission component 804 may transmit communications, such as reference signals, control information, data communications, or a combination thereof, to the apparatus 806. In some aspects, one or more other components of the apparatus 800 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modem, a modulator, a transmit MIMO processor, a transmit processor, a controller/processor, a memory, or a combination thereof, of the wireless communication device described in connection with FIG. 2. In some aspects, the transmission component 804 may be co-located with the reception component 802 in a transceiver.

The signal component 810 may obtain, from a digital port, a signal before amplification and transmission on at least a first transmit chain for first antenna elements of the wireless communication device and a second transmit chain for second antenna elements of the wireless communication device. The adjustment component 812 may adjust an amplification saturated power for the signal for the first transmit chain such that a first ratio of amplification saturated power to amplification output power of the first transmit chain aligns with a second ratio of amplification saturated power to amplification output power of the second transmit chain. The transmission component 804 may transmit the signal in association with wireless communication.

The adjustment component 812 may apply a pre-distortion operation on the signal before transmission. The adjustment component 812 may adjust the amplification saturated power for the first transmit chain and the amplification saturated power for the second transmit chain to taper a beam formed for transmitting the signal from the first antenna elements and the second antenna elements.

In some aspects, the signal component 810 may obtain, from a digital port, a signal before amplification and transmission on at least a first transmit chain for first antenna elements of the wireless communication device and a second transmit chain for second antenna elements of the wireless communication device. The adjustment component 812 may adjust an amplification output power for the signal for the first transmit chain such that a first ratio of amplification saturated power to amplification output power of the first transmit chain aligns with a second ratio of amplification saturated power to amplification output power of the second transmit chain. The transmission component 804 may transmit the signal in association with wireless communication.

The adjustment component 812 may adjust the amplification saturated power for the signal for the first transmit chain to set an effective isotropic radiated power while controlling power consumption. The adjustment component 812 may adjust an amplification saturated power for the signal for the first transmit chain such that the first ratio aligns with the second ratio. The adjustment component 812 may apply a pre-distortion operation on the signal before transmission.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

Figure 9:
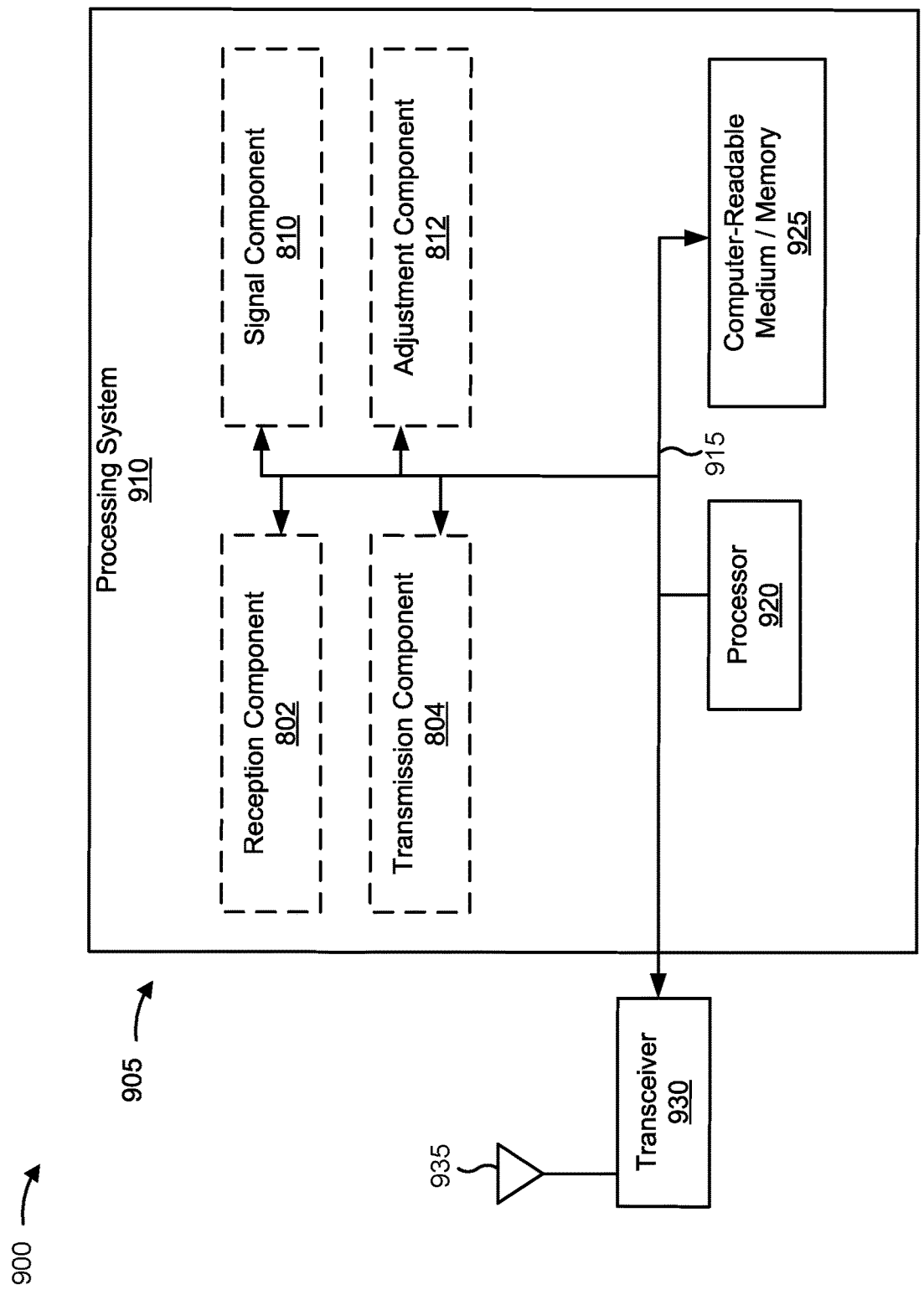
FIG. 9 is a diagram illustrating an example of a hardware implementation for an apparatus employing a processing system, in accordance with the present disclosure.

FIG. 9 is a diagram illustrating an example 900 of a hardware implementation for an apparatus 905 employing a processing system 910. The apparatus 905 may be a wireless communication device.

The processing system 910 may be implemented with a bus architecture, represented generally by the bus 915. The bus 915 may include any number of interconnecting buses and bridges depending on the specific application of the processing system 910 and the overall design constraints. The bus 915 links together various circuits including one or more processors and/or hardware components, represented by the processor 920, the illustrated components, and the computer-readable medium/memory 925. The bus 915 may also link various other circuits, such as timing sources, peripherals, voltage regulators, and/or power management circuits.

The processing system 910 may be coupled to a transceiver 930. The transceiver 930 is coupled to one or more antennas 935. The transceiver 930 provides a means for communicating with various other apparatuses over a transmission medium. The transceiver 930 receives a signal from the one or more antennas 935, extracts information from the received signal, and provides the extracted information to the processing system 910, specifically the reception component 802. In addition, the transceiver 930 receives information from the processing system 910, specifically the transmission component 804, and generates a signal to be applied to the one or more antennas 935 based at least in part on the received information.

The processing system 910 includes a processor 920 coupled to a computer-readable medium/memory 925. The processor 920 is responsible for general processing, including the execution of software stored on the computer-readable medium/memory 925. The software, when executed by the processor 920, causes the processing system 910 to perform the various functions described herein for any particular apparatus. The computer-readable medium/memory 925 may also be used for storing data that is manipulated by the processor 920 when executing software. The processing system further includes at least one of the illustrated components. The components may be software modules running in the processor 920, resident/stored in the computer-readable medium/memory 925, one or more hardware modules coupled to the processor 920, or some combination thereof.

In some aspects, the processing system 910 may be a component of the UE 120 and may include the memory 282 and/or at least one of the TX MIMO processor 266, the receive (RX) processor 258, and/or the controller/processor 280. In some aspects, the apparatus 905 for wireless communication includes means for obtaining, from a digital port, a signal before amplification and transmission on at least a first transmit chain for first antenna elements of the wireless communication device and a second transmit chain for second antenna elements of the wireless communication device; means for adjusting an amplification saturated power for the signal for the first transmit chain such that a first ratio of amplification saturated power to amplification output power of the first transmit chain aligns with a second ratio of amplification saturated power to amplification output power of the second transmit chain; and/or means for transmitting the signal in association with wireless communication. In some aspects, the apparatus 905 for wireless communication includes means for obtaining, from a digital port, a signal before amplification and transmission on at least a first transmit chain for first antenna elements of the wireless communication device and a second transmit chain for second antenna elements of the wireless communication device; means for adjusting an amplification output power for the signal for the first transmit chain such that a first ratio of amplification saturated power to amplification output power of the first transmit chain aligns with a second ratio of amplification saturated power to amplification output power of the second transmit chain; and/or means for transmitting the signal in association with wireless communication. The aforementioned means may be one or more of the aforementioned components of the apparatus 900 and/or the processing system 910 of the apparatus 905 configured to perform the functions recited by the aforementioned means. As described elsewhere herein, the processing system 910 may include the TX MIMO processor 266, the Rx processor 258, and/or the controller/processor 280. In one configuration, the aforementioned means may be the TX MIMO processor 266, the Rx processor 258, and/or the controller/processor 280 configured to perform the functions and/or operations recited herein.

In some aspects, the processing system 910 may be a component of the base station 110 and may include the memory 242 and/or at least one of the TX MIMO processor 230, the Rx processor 238, and/or the controller/processor 240. As described elsewhere herein, the processing system 910 may include the TX MIMO processor 230, the receive processor 238, and/or the controller/processor 240. In one configuration, the aforementioned means may be the TX MIMO processor 230, the receive processor 238, and/or the controller/processor 240 configured to perform the functions and/or operations recited herein.

FIG. 9 is provided as an example. Other examples may differ from what is described in connection with FIG. 9.

The following provides an overview of some Aspects of the present disclosure:

Aspect 1: A method of wireless communication performed by an apparatus of a wireless communication device, comprising: obtaining, from a digital port, a signal before amplification and transmission on at least a first transmit chain for first antenna elements of the wireless communication device and a second transmit chain for second antenna elements of the wireless communication device; adjusting an amplification saturated power for the signal for the first transmit chain such that a first ratio of amplification saturated power to amplification output power of the first transmit chain aligns with a second ratio of amplification saturated power to amplification output power of the second transmit chain; and transmitting the signal in association with wireless communication.

Aspect 2: The method of Aspect 1, wherein adjusting the amplification saturated power for the signal for the first transmit chain includes adjusting power supply voltage for a power amplifier for the first transmit chain.

Aspect 3: The method of Aspect 1 or 2, further comprising applying a pre-distortion operation on the signal before transmission.

Aspect 4: The method of any of Aspects 1-3, further comprising adjusting the amplification saturated power for the first transmit chain and the amplification saturated power for the second transmit chain to taper a beam formed for transmitting the signal from the first antenna elements and the second antenna elements.

Aspect 5: The method of any of Aspects 1-4, wherein the wireless communication device is a network entity.

Aspect 6: The method of any of Aspects 1-5, wherein the wireless communication device is a user equipment.

Aspect 7: A method of wireless communication performed by an apparatus of a wireless communication device, comprising: obtaining, from a digital port, a signal before amplification and transmission on at least a first transmit chain for first antenna elements of the wireless communication device and a second transmit chain for second antenna elements of the wireless communication device; adjusting an amplification output power for the signal for the first transmit chain such that a first ratio of amplification saturated power to amplification output power of the first transmit chain aligns with a second ratio of amplification saturated power to amplification output power of the second transmit chain; and transmitting the signal in association with wireless communication.

Aspect 8: The method of Aspect 7, wherein adjusting the amplification output power includes adjusting a gain or a bias voltage for the first transmit chain.

Aspect 9: The method of Aspect 7 or 8, further comprising adjusting the amplification saturated power for the signal for the first transmit chain to set an effective isotropic radiated power while controlling power consumption.

Aspect 10: The method of any of Aspects 7-9, further comprising adjusting an amplification saturated power for the signal for the first transmit chain such that the first ratio aligns with the second ratio.

Aspect 11: The method of any of Aspects 7-10, further comprising applying a pre-distortion operation on the signal before transmission.

Aspect 12: The method of any of Aspects 7-11, wherein the wireless communication device is a network entity.

Aspect 13: The method of any of Aspects 7-12, wherein the wireless communication device is a user equipment.

Aspect 14: An apparatus for wireless communication at a device, comprising a processor; memory coupled with the processor; and instructions stored in the memory and executable by the processor to cause the apparatus to perform the method of one or more of Aspects 1-13.

Aspect 15: A device for wireless communication, comprising a memory and one or more processors coupled to the memory, the one or more processors configured to perform the method of one or more of Aspects 1-13.

Aspect 16: An apparatus for wireless communication, comprising at least one means for performing the method of one or more of Aspects 1-13.

Aspect 17: A non-transitory computer-readable medium storing code for wireless communication, the code comprising instructions executable by a processor to perform the method of one or more of Aspects 1-13.

Aspect 18: A non-transitory computer-readable medium storing a set of instructions for wireless communication, the set of instructions comprising one or more instructions that, when executed by one or more processors of a device, cause the device to perform the method of one or more of Aspects 1-13.

The foregoing disclosure provides illustration and description but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a "processor" is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods are described herein without reference to specific software code, since those skilled in the art will understand that software and hardware can be designed to implement the systems and/or methods based, at least in part, on the description herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. Many of these features may be combined in ways not specifically recited in the claims and/or disclosed in the specification. The disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method of wireless communication performed by an apparatus of a wireless communication device, comprising:
    obtaining, from a digital port, a signal before amplification and transmission on at least a first transmit chain for first antenna elements of the wireless communication device and a second transmit chain for second antenna elements of the wireless communication device;
    adjusting an amplification saturated power for the signal for the first transmit chain such that a first ratio of amplification saturated power to amplification output power of the first transmit chain aligns with a second ratio of amplification saturated power to amplification output power of the second transmit chain; and
    transmitting the signal in association with wireless communication.

2. The method of claim 1, wherein adjusting the amplification saturated power for the signal for the first transmit chain includes adjusting power supply voltage for a power amplifier for the first transmit chain.

3. The method of claim 1, further comprising applying a pre-distortion operation on the signal before transmission.

4. The method of claim 1, further comprising adjusting the amplification saturated power for the first transmit chain and the amplification saturated power for the second transmit chain to taper a beam formed for transmitting the signal from the first antenna elements and the second antenna elements.

5. The method of claim 1, wherein the wireless communication device is a network entity.

6. The method of claim 1, wherein the wireless communication device is a user equipment.

7. A method of wireless communication performed by an apparatus of a wireless communication device, comprising:
    obtaining, from a digital port, a signal before amplification and transmission on at least a first transmit chain for first antenna elements of the wireless communication device and a second transmit chain for second antenna elements of the wireless communication device;
    adjusting an amplification output power for the signal for the first transmit chain such that a first ratio of amplification saturated power to amplification output power of the first transmit chain aligns with a second ratio of amplification saturated power to amplification output power of the second transmit chain; and
    transmitting the signal in association with wireless communication.

8. The method of claim 7, wherein adjusting the amplification output power includes adjusting a gain or a bias voltage for the first transmit chain.

9. The method of claim 7, further comprising adjusting the amplification saturated power for the signal for the first transmit chain to set an effective isotropic radiated power while controlling power consumption.

10. The method of claim 7, further comprising adjusting an amplification saturated power for the signal for the first transmit chain such that the first ratio aligns with the second ratio.

11. The method of claim 7, further comprising applying a pre-distortion operation on the signal before transmission.

12. The method of claim 7, wherein the wireless communication device is a network entity.

13. The method of claim 7, wherein the wireless communication device is a user equipment.

14. An apparatus of a wireless communication device, comprising:
a memory; and
one or more processors, coupled to the memory, configured to:
obtain, from a digital port, a signal before amplification and transmission on at least a first transmit chain for first antenna elements of the wireless communication device and a second transmit chain for second antenna elements of the wireless communication device;
adjust an amplification saturated power for the signal for the first transmit chain such that a first ratio of amplification saturated power to amplification output power of the first transmit chain aligns with a second ratio of amplification saturated power to amplification output power of the second transmit chain; and
transmit the signal in association with wireless communication.

15. The apparatus of claim 14, wherein the one or more processors, to adjust the amplification saturated power for the signal for the first transmit chain, are configured to adjust power supply voltage for a power amplifier for the first transmit chain.

16. The apparatus of claim 14, wherein the one or more processors are configured to apply a pre-distortion operation on the signal before transmission.

17. The apparatus of claim 14, wherein the one or more processors are configured to adjust the amplification saturated power for the first transmit chain and the amplification saturated power for the second transmit chain to taper a beam formed for transmitting the signal from the first antenna elements and the second antenna elements.

18. The apparatus of claim 14, wherein the wireless communication device is a network entity.

19. The apparatus of claim 14, wherein the wireless communication device is a user equipment.

20. An apparatus of a wireless communication device, comprising:
a memory; and
one or more processors, coupled to the memory, configured to:
obtain, from a digital port, a signal before amplification and transmission on at least a first transmit chain for first antenna elements of the wireless communication device and a second transmit chain for second antenna elements of the wireless communication device;
adjust an amplification output power for the signal for the first transmit chain such that a first ratio of amplification saturated power to amplification output power of the first transmit chain aligns with a second ratio of amplification saturated power to amplification output power of the second transmit chain; and
transmit the signal in association with wireless communication.

21. The apparatus of claim 20, wherein the one or more processors, to adjust the amplification output power, are configured to adjust a gain or a bias voltage for the first transmit chain.

22. The apparatus of claim 20, wherein the one or more processors are configured to adjust the amplification saturated power for the signal for the first transmit chain to set an effective isotropic radiated power while controlling power consumption.

23. The apparatus of claim 20, wherein the one or more processors are configured to adjust an amplification saturated power for the signal for the first transmit chain such that the first ratio aligns with the second ratio.

24. The apparatus of claim 20, wherein the one or more processors are configured to apply a pre-distortion operation on the signal before transmission.

25. The apparatus of claim 20, wherein the wireless communication device is a network entity.

26. The apparatus of claim 20, wherein the wireless communication device is a user equipment.

* * * * *